United States Patent [19]

Williams

[11] Patent Number: 5,094,288
[45] Date of Patent: Mar. 10, 1992

[54] METHOD OF MAKING AN ESSENTIALLY VOID-FREE, CAST SILICON AND ALUMINUM PRODUCT

[75] Inventor: Larry G. Williams, Rescue, Calif.

[73] Assignee: Silicon Casting, Inc., Rancho Cordova, Calif.

[21] Appl. No.: 616,620

[22] Filed: Nov. 21, 1990

[51] Int. Cl.$^5$ .................... B22D 23/06; B22D 27/04
[52] U.S. Cl. .................................. 164/80; 164/122.1
[58] Field of Search ............... 164/80, 122.1, 122, 164/125, 122.2, 61

[56] References Cited

U.S. PATENT DOCUMENTS

| | | | |
|---|---|---|---|
| 1,144,034 | 6/1915 | Giolitti | 164/122.1 |
| 1,812,172 | 6/1931 | Rohn | 164/122.1 |
| 4,193,974 | 3/1980 | Kotfval | 423/348 |

FOREIGN PATENT DOCUMENTS 3532131 3/1987 Fed. Rep. of Germany ... 164/122.1

Primary Examiner—Richard K. Seidel
Attorney, Agent, or Firm—Thomas R. Lampe

[57] ABSTRACT

A method of making an essentially void-free, cast silicon and aluminum product wherein silicon and aluminum components in solid form are placed in a receptacle, heated to completely melt the components and thoroughly and uniformly disperse the aluminum component within the silicon component, and cooling the mixture in a non-uniform manner whereby solidification of the mixture gradually progresses from one extremity of the mixture to another extremity thereof. The aluminum component does not exceed about 6% by weight of the total weight of the components in the receptacle. During solidification of the mixture, gases are vented therefrom through that portion of the mixture which is in a molten state.

8 Claims, 1 Drawing Sheet

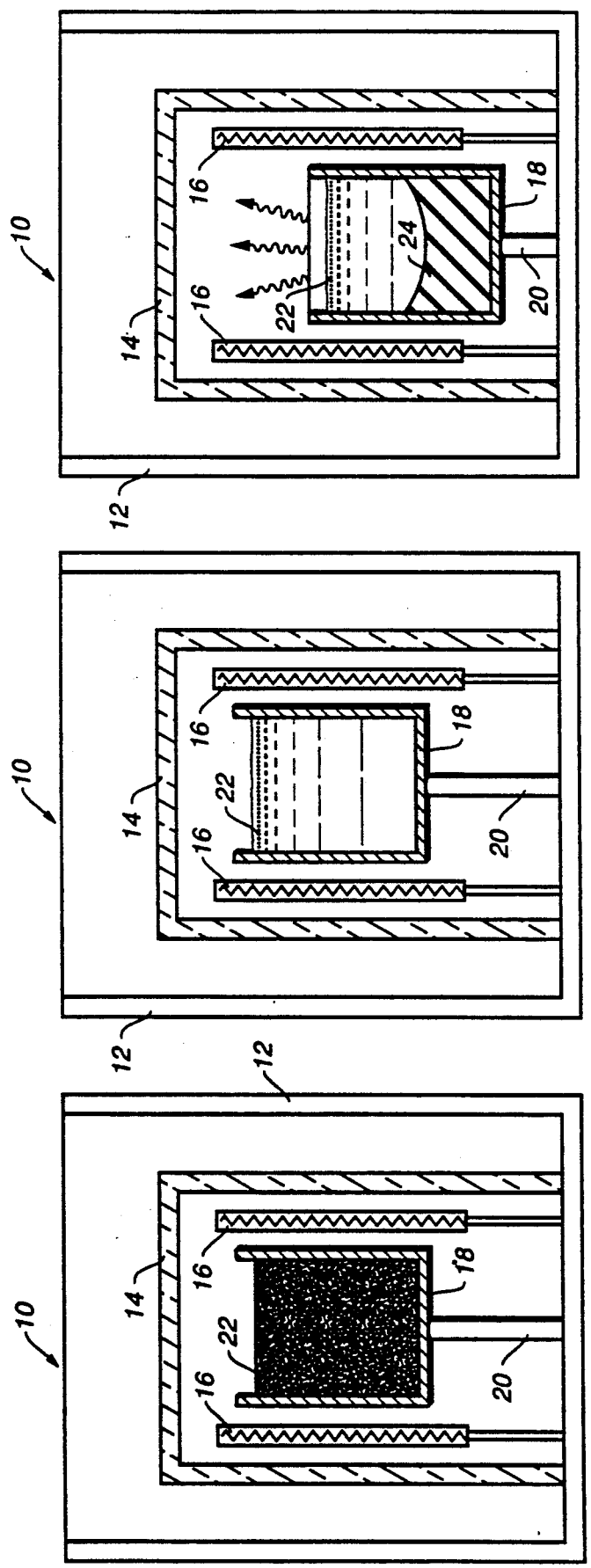

METHOD OF MAKING AN ESSENTIALLY VOID-FREE, CAST SILICON AND ALUMINUM PRODUCT

TECHNICAL FIELD

This invention relates to a method of making an essentially void-free, cast silicon and aluminum product. The product may, for example, be utilized as a target in a sputtering process to provide a silicon-aluminum coating on an article.

BACKGROUND ART

Targets utilized in a sputtering process have certain preferred characteristics. Among these are a high degree of uniformity insofar as the constituent materials of the target are concerned and a lack of significant voids in the target. A target not having these characteristics can easily result in non-uniformity of article coating, and uniformity is often an absolute requirement for certain articles and objects. This can result in very high waste costs.

Some sputtering applications call for the use of a target comprised of silicon and aluminum. Such a combination of elements has caused operational difficulties. Silicon-aluminum targets are typically formed by heating the silicon and aluminum to a high temperature and casting same in a mold.

Problems have been encountered in the process just described. First of all, it has been found that conventional casting techniques result in the formation of an unacceptable number of voids in the final casting. These voids are caused by gases formed during heating.

Furthermore, it has been found that the final casting often is not uniform throughout. That is, more specifically, it has been found that the aluminum component of the casting is not uniformly dispersed throughout the silicon component. The casting can include relatively large masses of aluminum embedded in an otherwise uniform mixture of silicon and aluminum. These masses and voids create, as mentioned above, significant problems when the cast product is utilized as a target when carrying out a sputtering process.

DISCLOSURE OF INVENTION

The present invention relates to a method of making an essentially void-free, cast silicon and aluminum product. In addition to being essentially free of voids, the product is characterized by the lack of discrete masses of aluminum. In other words, the aluminum is intimately and uniformly dispersed throughout the silicon.

In accordance with the teachings of the method, silicon and aluminum components in solid form are placed in a receptacle, the aluminum component not exceeding about 6% by weight of the total weight of the silicon and aluminum components in the receptacle.

After the step of placing the silicon and aluminum components in the receptacle, the components are heated to a temperature sufficient to completely melt both the silicon component and the aluminum component and form an intimate molten mixture of the silicon and aluminum components. Heating of the molten mixture is continued until the melted aluminum component is thoroughly and uniformly dispersed within the melted silicon component.

After the melted aluminum component is thoroughly and uniformly dispersed within the melted silicon component, cooling of the mixture takes place. Cooling of the mixture is carried out in a non-uniform manner whereby solidification of the mixture gradually progresses from one extremity of the mixture to another extremity thereof to form a solid casting.

During the cooling step and prior to formation of the solid casting, gases are purged from the mixture so that the gases will not form voids in the solid casting.

According to a preferred embodiment of the invention, the receptacle is a crucible disposed adjacent to a source of heat for heating the silicon and aluminum components in the crucible. The step of cooling the mixture in a non-uniform manner includes the step of moving the crucible and the source of heat relative to one another to move the bottom of the crucible a further distance from the source.

Other features, advantages, and objects of the present invention will become apparent with reference to the following description and accompanying drawings.

BRIEF DESCRIPTION OF DRAWINGS

FIG. 1 is a diagrammatic, cross-sectional side view of apparatus employed when carrying out the teachings of the present invention and illustrating the operative relationship of the components thereof during the initial stage of the process of the present invention;

FIG. 2 is a view similar to FIG. 1 during a subsequent step of the method; and

FIG. 3 is a view similar to FIGS. 1 and 2, but illustrating a step in the process carried out after the step of FIG. 2.

BEST MODE FOR CARRYING OUT THE INVENTION

Referring now to the drawings, a high-temperature furnace is generally designated by reference numeral 10. One suitable furnace which may be utilized to carry out the teachings of the present invention is a Siltec crystal growing furnace made available by Siltec Corp.

As is conventional, furnace 10 includes an outer wall 12 within which is disposed a housing 14 at least partially formed of a suitable insulating material such as graphite felt. Disposed within housing 14 is a suitable source of heat such as a graphite resistance heater 16. It will be appreciated that the heater 16 conventionally forms a upright cylinder within housing 14.

A receptacle is mounted within the graphite resistance heater 16. The receptacle is designated by reference numeral 18 and may suitably comprise a fused quartz crucible held by a graphite crucible holder. The receptacle 18 is disposed on a shaft 20 which may be raised or lowered by any suitable mechanism such as a hydraulic cylinder (not shown).

When carrying out the teachings of the present invention, aluminum and silicon components in solid form are placed in receptacle 18. The silicon is preferably pure polycrystalline silicon. It is important that the aluminum component not exceed about 6% by weight of the total weight of the aluminum and silicon components in the receptacle. The components themselves may need not be in any particular form and may, for example, be either in the form of small particles or relatively large masses. In FIG. 1 the mix of silicon and aluminum components is designated by reference numeral 22.

After the silicon and aluminum components are placed in the receptacle, the components are heated by graphite resistance heater 16 to a temperature sufficient to completely melt both the silicon component and the aluminum component and form an intimate molten mixture of the components.

Pure silicon melts at 1,410 degrees Celsius. The addition of aluminum drops the melting temperature. For example, an alloy of silicon with 6% aluminum melts at approximately 1,400 degrees Celsius. Heating of the molten mixture continues until the melted aluminum component is thoroughly and uniformly dispersed within the melted silicon component. This process may take, for example, in the order of one hour.

After the melted aluminum component is thoroughly and uniformly dispersed within the melted silicon component, the mixture is cooled in a non-uniform manner whereby solidification of the mixture gradually progresses from an extremity of the mixture to another extremity thereof during formation of a solid casting.

In the arrangement shown, one suitable approach for accomplishing this is illustrated. FIG. 2 shows the receptacle 18 within the confines of heater 16. This relationship exists until the mixture 22 is molten, as shown, and the melted aluminum component is thoroughly and uniformly dispersed within the melted silicon component. After this occurs, the receptacle 18 is moved downwardly relative to the heater 16 to the position shown in FIG. 3. In this latter position the bottom of the receptacle 18 is moved away from the heater and out of registry therein.

Power to the heater is now reduced to a level sufficient to keep the upper portion of the melt molten while allowing the mixture 22 to solidify from the bottom up. That is, solidification of the mixture 22 gradually progresses from the lower end of the mixture in engagement when the crucible bottom toward the upper end of the mixture. In FIG. 3 the surface of juncture or demarcation between the solid and molten portions of the mixture is designated by reference numeral 24.

While solidification of the mixture gradually progresses upwardly, gases within the mixture are purged. Solidification of the mixture from the bottom up results in the gases being directed upwardly within the mixture where the mixture is in a molten state and the venting of the directed gases through and out of the upper end of the mixture as shown by the arrows in FIG. 3.

From the time the receptacle is lowered, the purging of the gases can take in the order of five hours or so. After this period of time power to the heater 16 is turned off entirely and the furnace is allowed to cool. The mixture 22 then becomes completely solidified.

With the process just described, it has been found that the finished cast product has no more than about 0.1% voids by volume. Furthermore, the cast product is a uniform and intimate mixture of silicon and aluminum, without the presence of undesired discrete masses of aluminum. It has been found that the use of more than about 6% by weight of aluminum of the total weight of the components in the receptacle can result in the formation of such unwanted masses.

After formation of the casting from the mixture 22, the casting may be sawn or otherwise converted to form a desired target configuration for use in a sputtering process.

I claim:

1. A method of making an essentially void-free, cast silicon and aluminum product characterized by the lack of discrete masses of aluminum, said aluminum being intimately and uniformly dispersed throughout the silicon, said method comprising the steps of:

placing silicon and aluminum components in solid form in a receptacle, said aluminum component not exceeding about 6% by weight of the total weight of said components in said receptacle;

after the step of placing said silicon and aluminum components in said receptacle, heating said silicon and aluminum components to a temperature sufficient to completely melt both said silicon component and said aluminum component and form an intimate molten mixture of said silicon and aluminum components;

continuing the heating of said molten mixture until the melted aluminum component is thoroughly and uniformly dispersed within said melted silicon component;

after said melted aluminum component is thoroughly and uniformly dispersed within the melted silicon component, cooling said mixture in a non-uniform manner whereby solidification of said mixture gradually processes from one extremity of the mixture to another extremity thereof during formation of a solid casting without producing discrete masses of aluminum in said solid casting; and during said cooling step and prior to formation of said solid casting, purging gases from said mixture whereby said gases will not form voids in said solid casting.

2. The method according to claim 1 wherein said receptacle is a crucible disposed adjacent to a source of heat for heating the silicon and aluminum components in said crucible, said step of cooling said mixture in a non-uniform manner including the step of moving said crucible and said source of heat relative to one another to move the bottom of said crucible a further distance from said source.

3. The method according to claim 2 wherein solidification of said mixture gradually progresses from the lower end of the mixture in engagement with the crucible bottom to the upper end of said mixture.

4. The method according to claim 3 wherein the step of purging said gases comprises the step of directing the gases upwardly within the mixture when said mixture is in a molten state and venting said directed gases through and out of the upper end of said mixture.

5. The method according to claim 2 additionally comprising the step of de-actuating said source of heat after passage of a predetermined period of time commencing from relative movement between said crucible and said source of heat.

6. The method according to claim 1 wherein sufficient gases are purged from said mixture to result in a cast product having no more than about 0.1 per cent voids by volume.

7. The method according to claim 1 wherein the silicon is polycrystalline silicon.

8. A substantially void-free cast silicon and aluminum product formed by the method of claim 1.

* * * * *